(12) United States Patent
Ohe et al.

(10) Patent No.: US 11,881,685 B2
(45) Date of Patent: Jan. 23, 2024

(54) ION GENERATION DEVICE, DISCHARGE SUBSTRATE, AND ELECTRONIC DEVICE

(71) Applicant: SHARP KABUSHIKI KAISHA, Sakai (JP)

(72) Inventors: Nobuyuki Ohe, Sakai (JP); Tetsuya Ezaki, Sakai (JP); Satoshi Okano, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 439 days.

(21) Appl. No.: 17/296,113

(22) PCT Filed: Nov. 20, 2019

(86) PCT No.: PCT/JP2019/045386
§ 371 (c)(1),
(2) Date: May 21, 2021

(87) PCT Pub. No.: WO2020/110851
PCT Pub. Date: Jun. 4, 2020

(65) Prior Publication Data
US 2022/0021191 A1    Jan. 20, 2022

(30) Foreign Application Priority Data
Nov. 27, 2018 (JP) ................. 2018-221708

(51) Int. Cl.
*H01T 23/00* (2006.01)
*B03C 3/41* (2006.01)
*H01L 21/84* (2006.01)

(52) U.S. Cl.
CPC ............... *H01T 23/00* (2013.01); *B03C 3/41* (2013.01); *H01L 21/84* (2013.01); *B03C 2201/06* (2013.01)

(58) Field of Classification Search
CPC ...... B03C 2201/06; H01T 19/04; H01T 23/00
See application file for complete search history.

(56) References Cited

U.S. PATENT DOCUMENTS

2011/0102963 A1* 5/2011 Sekoguchi .............. B03C 3/383
361/230
2016/0204581 A1* 7/2016 Nishida ................... H01T 23/00
250/423 F (Continued)

FOREIGN PATENT DOCUMENTS

JP      2001-338743 A    12/2001
JP          5234762 B2     7/2013

(Continued)

*Primary Examiner* — Raj R Gupta
(74) *Attorney, Agent, or Firm* — ScienBiziP, P.C.

(57) ABSTRACT

An ion generation device includes a discharge electrode substrate, an induction electrode substrate, and an insulating resin. The discharge electrode substrate on which a discharge electrode is mounted and a first electrode connected to the discharge electrode is formed. The induction electrode substrate on which an induction electrode configured to generate a discharge between the induction electrode and the discharge electrode and a second electrode connected to the induction electrode are formed. The insulating resin is filled at least between the discharge electrode and the induction electrode. The insulating resin provides insulation between the discharge electrode and the induction electrode. The first electrode and the second electrode are disposed and face each other at least partially. The first electrode, the second electrode, and the insulating resin interposed between the first electrode and the second electrode form a capacitor.

7 Claims, 6 Drawing Sheets

(56) References Cited

U.S. PATENT DOCUMENTS

2016/0211654 A1 7/2016 Sekoguchi et al.
2016/0218490 A1 7/2016 Nishida et al.

FOREIGN PATENT DOCUMENTS

| JP | 2015022996 A | | 2/2015 |
|---|---|---|---|
| JP | 2018101635 A | * | 6/2018 |
| WO | 2015/049933 A1 | | 4/2015 |
| WO | 2015/141034 A1 | | 9/2015 |

* cited by examiner

ION GENERATION DEVICE, DISCHARGE SUBSTRATE, AND ELECTRONIC DEVICE

TECHNICAL FIELD

The present invention relates to an ion generation device.

BACKGROUND ART

The ion generation device increases an input voltage of an alternate current by a transformer, further performs rectification and smoothing, and then applies the voltage to a discharge electrode to generate a high-pressure discharge, thereby generating ions.

For example, PTL 1 discloses an ion generation device provided with a high-voltage capacitor for the above smoothing. PTL 2 discloses that a waveform of a pulse voltage output from a transformer is smoothed by a capacitor to reduce a peak value of the pulse voltage.

CITATION LIST

Patent Literature

PTL 1: JP 2001-338743 A (published on Dec. 7, 2001)
PTL 2: JP 5234762 B (issued on Jul. 10, 2013)

SUMMARY OF INVENTION

Technical Problem

A high-voltage capacitor is large, such that a footprint thereof on a substrate is large, and is expensive. In addition, when the high-voltage capacitor is incorporated into an ion generation device as a chip component, the disposition position of which on the substrate is limited.

An aspect of the present invention is directed to eliminating a need for a capacitor as a component.

Solution to Problem

In order to solve the above problem, an ion generation device according to an aspect of the present invention includes: a discharge electrode substrate on which a discharge electrode is mounted and a first electrode connected to the discharge electrode is formed; an induction electrode substrate on which an induction electrode configured to generate a discharge between the induction electrode and the discharge electrode and a second electrode connected to the induction electrode are formed; and an insulating resin filled at least between the discharge electrode and the induction electrode and providing insulation between the discharge electrode and the induction electrode, in which the first electrode and the second electrode are disposed so as to face each other at least partially, and the first electrode, the second electrode, and the insulating resin interposed between the first electrode and the second electrode form a capacitor.

Advantage Effects of Invention

According to an aspect of the present invention, it is possible to eliminate a need for a capacitor as a component.

DESCRIPTION OF EMBODIMENTS

First Embodiment

Hereinafter, a first embodiment of the present invention will be described with reference to FIGS. 1 to 4.

Figure 1:
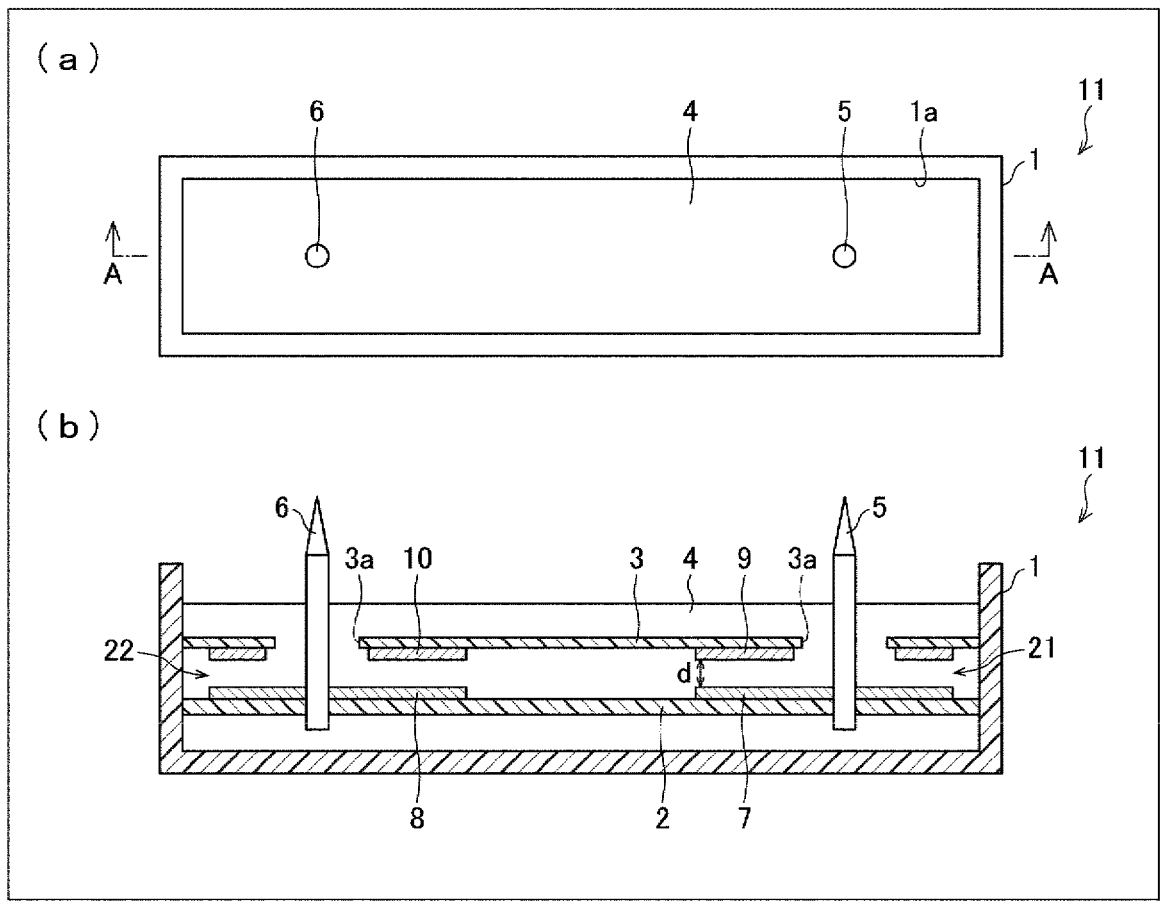
FIG. 1(a) is a plan view illustrating a configuration of an ion generation device according to a first embodiment of the present invention.
FIG. 1(b) is a cross-sectional view taken along a line A-A of FIG. 1(a).
Figure 2:
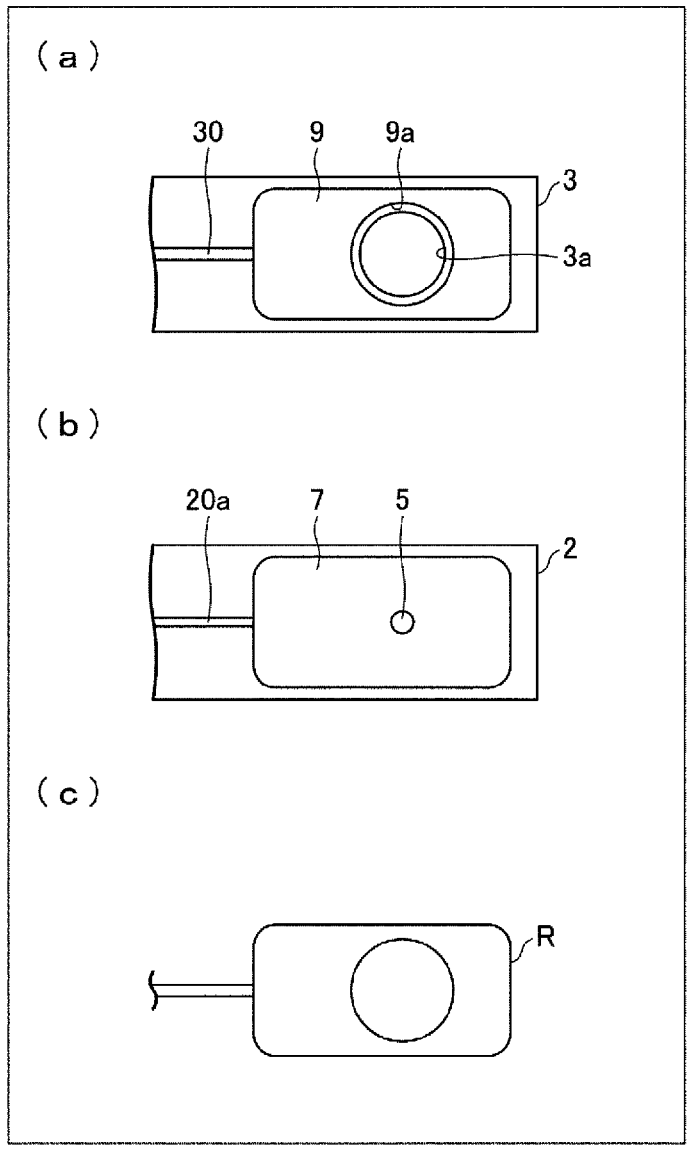
FIG. 2(a) is a bottom view illustrating a configuration of an induction electrode substrate in the ion generation device.
FIG. 2(b) is a top view illustrating a configuration of a discharge electrode substrate in the ion generation device.
FIG. 2(c) is a view illustrating an overlapping region in which a planar electrode formed on the discharge electrode substrate and a composite electrode provided on the induction electrode substrate overlap each other in a direction perpendicular to surfaces of the induction electrode substrate and the discharge electrode substrate.

(a) of FIG. 1 is a plan view illustrating a configuration of an ion generation device 11 according to the first embodiment. (b) of FIG. 1 is a cross-sectional view taken along a line A-A in (a) of FIG. 1. (a) of FIG. 2 is a bottom view illustrating a configuration of an induction electrode substrate 3 in the ion generation device 11. (b) of FIG. 2 is a top view illustrating a configuration of a discharge electrode substrate 2 in the ion generation device 11. (c) of FIG. 2 is a view illustrating an overlapping region R in which a planar electrode 7 formed on the discharge electrode substrate 2 and a composite electrode 9 formed on the induction electrode substrate 3 overlap each other in a direction perpendicular to surfaces of the induction electrode substrate 3 and the discharge electrode substrate 2.

Note that although (a) to (c) of FIG. 2 illustrate only a discharge electrode 5 side, a discharge electrode 6 side is configured similarly to the discharge electrode 5 side.

As illustrated in (a) and (b) of FIG. 1, the ion generation device 11 includes a housing 1, the discharge electrode substrate 2, the induction electrode substrate 3, an insulating resin 4, discharge electrodes 5, 6, planar electrodes 7, 8 (first electrode), and composite electrodes 9, 10 (induction electrode, second electrode).

The housing 1 is formed in a box shape using an insulating resin. The housing 1 is provided with an opening 1a on a surface including a long side and a short side of three sides that define the box shape (upper surface in an example of (a) of FIG. 1). The housing 1 includes the discharge electrode substrate 2, the induction electrode substrate 3, and a part of the discharge electrodes 5, 6 inside the housing 1.

The inside of the housing 1 is filled with the insulating resin 4. Examples of a resin material that forms the insulating resin 4 include epoxy resins and urethane resins. The insulating resin 4 provides electrical insulation between the discharge electrode substrate 2 and the induction electrode substrate 3. In addition, the opening 1a is sealed by the insulating resin 4, and thus dust or the like can be prevented from adhering to the discharge electrode substrate 2 and the induction electrode substrate 3 even if the opening 1a does not have a lid body.

The discharge electrode substrate 2 and the induction electrode substrate 3 are elongated and substantially rectangular circuit boards. The discharge electrode substrate 2 is disposed above a bottom portion of the housing 1, spaced from the bottom portion. The induction electrode substrate 3 is disposed above the discharge electrode substrate 2, spaced from and in parallel to the discharge electrode substrate 2. Furthermore, the discharge electrode substrate 2 and the induction electrode substrate 3 (only the substrate portion) are formed of a resin such as epoxy.

The discharge electrodes 5, 6 are mounted on the discharge electrode substrate 2 at a predetermined interval in a longitudinal direction of the discharge electrode substrate 2. The discharge electrodes 5, 6 are fixed to the discharge electrode substrate 2 so as to stand vertically from a surface of the discharge electrode substrate 2 and protrude from a surface of the insulating resin 4. Furthermore, the discharge electrodes 5, 6 each are a needle-like electrode having a sharpened tip. The discharge electrodes 5, 6 each are not limited to a needle-like electrode, but may be an electrode having a tip formed into a brush shape.

In addition, as illustrated in (b) of FIG. 2, the planar electrode 7 is formed around the discharge electrode 5 on the discharge electrode substrate 2 so as to be connected over the entire circumference of the discharge electrode 5. The planar electrode 7 is formed integrally with a wiring pattern 20a on a surface of the discharge electrode substrate 2 facing the induction electrode substrate 3, by using, for example, copper foil. Although not illustrated, the planar electrode 8 is also configured to be the same as the planar electrode 7.

Note that the planar electrodes 7, 8 need not be formed around the discharge electrodes 5, 6, respectively and may be formed at positions away from the discharge electrodes 5, 6 on the discharge electrode substrate 2 as long as the planar electrodes 7, 8 are electrically connected to the discharge electrodes 5, 6.

Two openings 3a are formed in the induction electrode substrate 3, which are circular at a predetermined interval in a longitudinal direction of the induction electrode substrate 3. The discharge electrodes 5, 6 are disposed so as to pass through the induction electrode substrate 3 at the two openings 3a.

As illustrated in (a) of FIG. 2, the composite electrode 9 is formed on a surface of the induction electrode substrate 3 facing the discharge electrode substrate 2 and around one of the openings 3a provided in the induction electrode substrate 3. Thus, the composite electrode 9 includes an opening 9a having a circular shape and a diameter slightly larger than that of the opening 3a. The composite electrode 9 is formed integrally with a wiring pattern 30 formed on the induction electrode substrate 3, by using, for example, copper foil. Although not illustrated, the composite electrode 10 is also configured to be the same as the composite electrode 9.

The composite electrode 9 is an electrode that serves as both an induction electrode and an electrode of a capacitor 21 described later. The composite electrode 10 is an electrode that serves as both an induction electrode and an electrode of a capacitor 22 described later.

The induction electrode which the composite electrode 9 serves as is an electrode that generates a discharge between the electrode and the discharge electrode 5, while the induction electrode which the composite electrode 10 serves as is an electrode that generates a discharge between the electrode and the discharge electrode 6. The discharge electrode 5 generates positive ions between the discharge electrode 5 and the composite electrode 9 (induction electrode), while the discharge electrode 6 generates negative ions between the discharge electrode 6 and the composite electrode 10 (induction electrode).

Note that the composite electrodes 9, 10 do not necessarily have to serve as both the induction electrodes and the electrodes of the capacitors 21, 22 described later, and may be formed separately from the induction electrodes as electrodes of the capacitors 21, 22. In this configuration, two induction electrodes corresponding to the discharge electrodes 5, 6, respectively, are formed around the two openings 3a in the induction electrode substrate 3 and are connected to each other. In addition, the electrodes of the capacitors 21, 22 are electrically connected to the corresponding induction electrodes on the induction electrode substrate 3 via a wiring pattern and are formed at positions away from the induction electrodes.

The planar electrodes 7, 8 and the composite electrodes 9, 10 each are formed into a rectangular shape so as to conform to the shape of the discharge electrode substrate 2 and the induction electrode substrate 3. However, the shapes of the planar electrodes 7, 8 and the composite electrodes 9, 10 each are not limited to a rectangular shape. In addition, the planar electrodes 7, 8 and the composite electrodes 9, 10 are disposed so as to face each other at least partially. Specifically, as illustrated in (c) of FIG. 2, the planar electrode 7 and the composite electrode 9 face each other in the overlapping region R in which the planar electrode 7 and the composite electrode 9 overlap with each other in a direction perpendicular to surfaces of both the discharge electrode substrate 2 and the induction electrode substrate 3. Although not illustrated, the planar electrode 8 and the composite electrode 10 face each other in an overlapping region like the overlapping region R, in which the planar electrode 8 and the composite electrode 10 overlap with each other in a direction perpendicular to surfaces of both the discharge electrode substrate 2 and the induction electrode substrate 3.

The ion generation device 11 includes the capacitors 21, 22. The planar electrode 7, the composite electrode 9, and the insulating resin 4 interposed between the planar electrode 7 and the composite electrode 9 form the capacitor 21. The planar electrode 8, the composite electrode 10, and the insulating resin 4 interposed between the planar electrode 8 and the composite electrode 10 form the capacitor 22. In the capacitors 21, 22, the insulating resin 4 functions as a dielectric.

A capacitance C of each of the capacitors 21, 22 is expressed by the following equation, where an area of the overlapping region R is S. In the following equation, ε is a dielectric constant of the insulating resin 4, and d is a distance between the planar electrodes 7, 8 and the composite electrodes 9, 10.

$$C=\varepsilon(S/d)$$

The capacitance C of each of the capacitors 21, 22 can be adjusted by adjusting at least one of the area S, the dielectric constant ε, and the distance d.

Next, a circuit configuration of the ion generation device 11 will be described.

Figure 3:
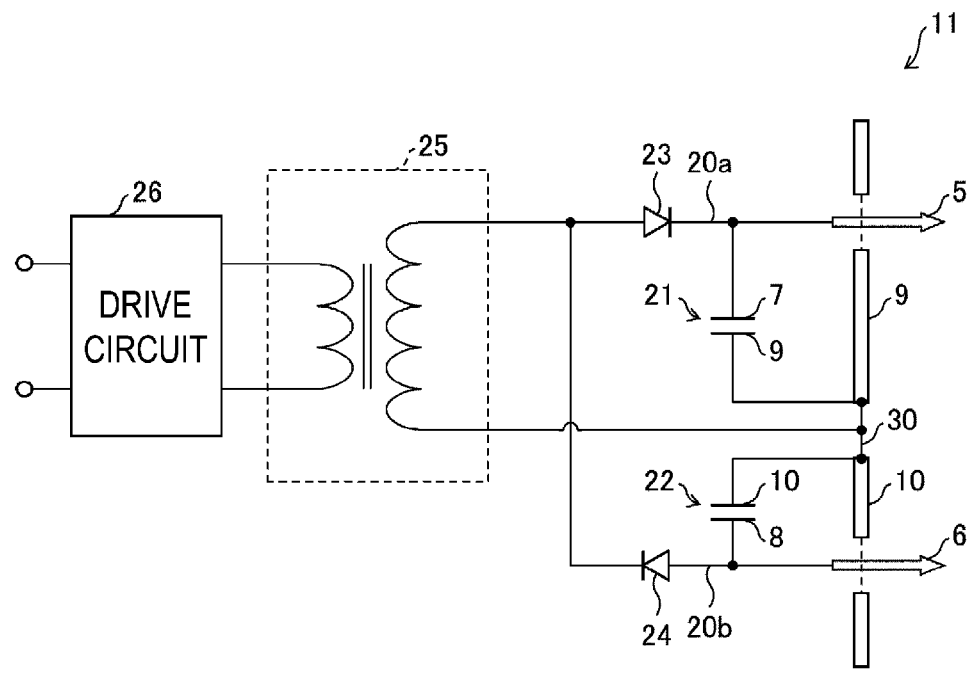
FIG. 3 is a circuit diagram illustrating a circuit configuration of the ion generation device.

FIG. 3 is a circuit diagram illustrating the circuit configuration of the ion generation device 11.

As illustrated in FIG. 3, the ion generation device 11 further includes diodes 23, 24, a transformer 25, and a drive circuit 26.

An anode of the diode 23 and a cathode of the diode 24 are connected to one terminal of a secondary coil (high voltage side) in the transformer 25. A cathode of the diode 23 is connected to: the planar electrode 7 which also serves as one electrode of the capacitor 21; and the discharge electrode 5 via the wiring pattern 20a formed on the discharge electrode substrate 2. An anode of the diode 24 is connected to: the planar electrode 8 which also serves as one electrode of the capacitor 22; and the discharge electrode 6 via a wiring pattern 20b formed on the discharge electrode substrate 2. The diode 23 rectifies a high voltage of an alternate current output from the transformer 25 to apply a positive voltage to the discharge electrode 5. The diode 24 rectifies the high voltage of the alternating current output from the transformer 25 to apply a negative voltage to the discharge electrode 6.

The composite electrode 9 forms the other electrode of the capacitor 21, and the composite electrode 10 forms the other electrode of the capacitor 22. The composite electrode 9 and the composite electrode 10 are connected to each other via the wiring pattern 30 formed on the induction electrode substrate 3, and are connected to the other terminal of the secondary coil in the transformer 25.

The drive circuit 26 converts an input direct current voltage to an alternate current voltage at a predetermined frequency and applies the converted alternate current voltage to a primary coil of the transformer 25 to drive the transformer 25.

In the ion generation device 11 configured as described above, the planar electrode 7, the composite electrode 9, and the insulating resin 4 interposed between the planar electrode 7 and the composite electrode 9 form the capacitor 21. Furthermore, in the ion generation device 11, the planar electrode 8, the composite electrode 10, and the insulating resin 4 interposed between the planar electrode 8 and the composite electrode 10 form the capacitor 22.

This makes it possible to eliminate the need for a capacitor serving as a high-voltage component. Thus, it is possible to reduce an area for mounting the capacitor on the discharge electrode substrate 2 or the induction electrode substrate 3. Accordingly, it is possible to reduce a size of the discharge electrode substrate 2 or the induction electrode substrate 3. Thus, it is possible to minimize the ion generation device 11.

In addition, the capacitors 21, 22 are composed of using existing components such as the discharge electrode substrate 2, the induction electrode substrate 3, and the insulating resin 4. This makes it possible to make the ion generation device 11 inexpensively. Moreover, the capacitances of the capacitors 21, 22 can be easily adjusted by adjusting at least one of the overlapping regions of patterns of the planar electrodes 7, 8 and the composite electrodes 9, 10, the intervals between the electrodes, and the dielectric constant of the insulating resin 4.

Incidentally, the ion generation device disclosed in PTL 2 uses a floating capacitance between a discharge electrode and a ground to apply a smoothed direct current high voltage to the discharge electrode. In addition, in the ion generation device, a smoothing capacitor having a large capacitance is required to apply a direct current high voltage to the discharge electrode. As a result, the smoothing capacitor becomes large, which makes it difficult to minimize the ion generation device. Furthermore, the ion generation device includes a discharge electrode but does not include an induction electrode, and thus a reference of potential is a ground. This destabilizes electric field distribution with respect to nearby metal objects or charged objects.

In contrast, in the ion generation device 11 of the present embodiment, the planar electrodes 7, 8 and the composite electrodes 9, 10 constituting the electrodes of the capacitors 21, 22 have less constraints on the positions at which the planar electrodes 7, 8 and the composite electrodes 9, 10 are formed on the discharge electrode substrate and on the induction electrode substrate, unlike the capacitor component. Thus, the planar electrodes 7, 8 and the composite electrodes 9, 10 can be provided in regions not used in the discharge electrode substrate 2 and the induction electrode substrate 3, respectively. This makes it unnecessary to secure a region for mounting the capacitor component on the discharge electrode substrate 2 and the induction electrode substrate 3, and the areas of the discharge electrode substrate 2 and the induction electrode substrate 3 can be reduced. Thus, the ion generation device 11 having a small size can be provided. In addition, in the ion generation device 11, existing components, rather than a floating capacitance, constitute the capacitors 21, 22. This makes it possible to obtain the capacitance stably, and set an induction electrode as the reference of potential.

Furthermore, because the ion generation device 11 is provided with the high-voltage capacitors 21, 22, the ion generation device 11 can smooth a waveform of a pulse voltage to achieve both an improvement in ion generation efficiency and a reduction in discharge noise, as in the ion generation device disclosed in PTL 2.

Modified Example

Figure 4:
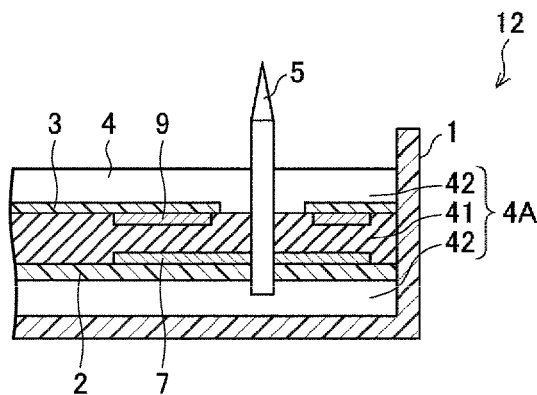
FIG. 4 is a vertical cross-sectional view illustrating a configuration of a part of an ion generation device according to a modified example of the first embodiment.

Next, an ion generation device according to a modified example of the present embodiment will be described. FIG. 4 is a vertical cross-sectional view illustrating a configuration of a part of an ion generation device 12 of the modified example.

As illustrated in FIG. 4, the ion generation device 12 is configured in the same manner as the ion generation device 11 except that an insulating resin 4A is provided instead of the insulating resin 4.

The insulating resin 4A includes a first resin layer 41 and a second resin layer 42. The first resin layer 41 is filled between the discharge electrode substrate 2 and the induction electrode substrate 3. The second resin layer 42 is disposed on the induction electrode substrate 3 so as to be in contact with the induction electrode substrate 3, and is disposed between the bottom portion of the housing 1 and the discharge electrode substrate 2 so as to be in contact with the discharge electrode substrate 2.

A procedure for forming the insulating resin 4A generally includes the following three steps. First, in a state in which a resin material for forming the second resin layer 42 is filled on the bottom portion of the housing 1, the discharge electrode substrate 2 is disposed on the resin material, and the resin material is cured to form the second resin layer 42 on the bottom portion. Next, in a state in which a resin material for forming the first resin layer 41 is filled on the discharge electrode substrate 2, the induction electrode substrate 3 is disposed on the resin material, and the resin material is cured to form the first resin layer 41. Then, the resin material for forming the second resin layer 42 is filled on the induction electrode substrate 3 and cured to form the second resin layer 42.

A dielectric constant of the first resin layer 41 is higher than a dielectric constant of the second resin layer 42. As a result, the dielectric constant of the dielectric of each of the capacitors 21, 22 is set to be high, and thus the capacitors 21, 22 suitable for high voltage can be obtained.

In addition, because a resin material having a high dielectric constant is generally expensive, if the resin material is used to form the entire insulating resin 4A, a price of the ion generation device 12 is increased. Against this, the insulating resin 4A is divided into the first resin layer 41 and the second resin layer 42 to be formed, and the resin material for forming the first resin layer 41 that constitutes the capacitors 21, 22 and the resin material for forming the second resin layer 42 are made different. As a result, a cost required to form the insulating resin 4A can be reduced. Accordingly, an increase in price of the ion generation device 12 can be suppressed.

Note that the configuration of the present modified example can also be applied to ion generation devices 13 to 15 according to a second embodiment below (see FIGS. 5 to 7).

Second Embodiment

Hereinafter, the second embodiment of the present invention will be described with reference to FIGS. 5 to 7. Note that, for the sake of description, components having functions the same as the functions of the components described in the first embodiment are denoted by the same reference signs, and description thereof will be herein omitted.

Figure 5:
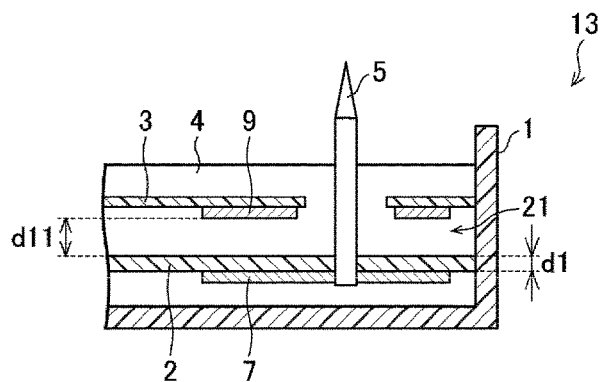
FIG. 5 is a vertical cross-sectional view illustrating a configuration of a part of an ion generation device according to a second embodiment of the present invention.

FIG. 5 is a vertical cross-sectional view illustrating a configuration of a part of an ion generation device 13 according to the present embodiment. FIG. 6 is a vertical cross-sectional view illustrating a configuration of a part of another ion generation device 14 according to the present embodiment. FIG. 7 is a vertical cross-sectional view illustrating a configuration of a part of still another ion generation device 15 according to the present embodiment.

Figure 6:
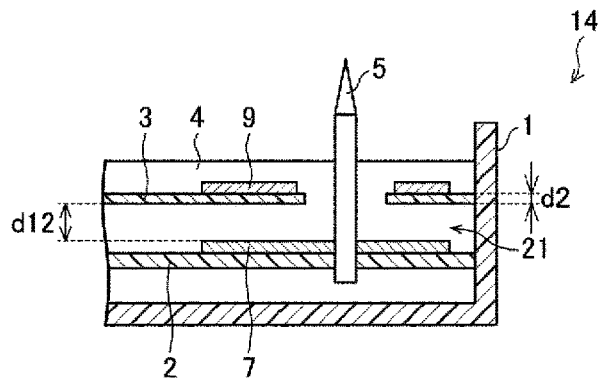
FIG. 6 is a vertical cross-sectional view illustrating a configuration of a part of another ion generation device according to the second embodiment of the present invention.
Figure 7:
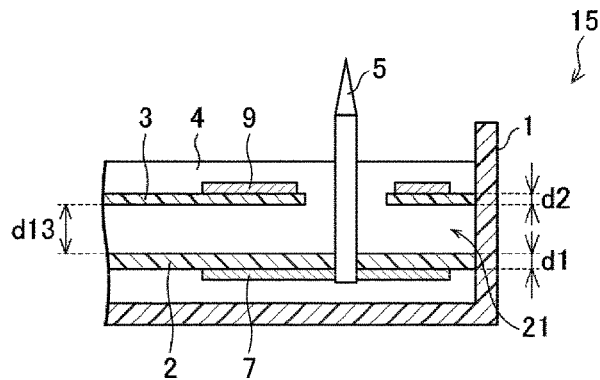
FIG. 7 is a vertical cross-sectional view illustrating a configuration of a part of still another ion generation device according to the second embodiment of the present invention.

Note that in FIGS. 5 to 7, a configuration of a portion including the discharge electrode 6 is omitted for convenience, but the portion is also configured to be the same as the portions illustrated in FIGS. 5 to 7.

As illustrated in FIG. 5, the ion generation device 13 is configured in the same manner as the ion generation device 11, except that the planar electrode 7 (planar electrode 8) is formed on a surface of the discharge electrode substrate 2 opposite to the surface of the discharge electrode substrate 2 facing the induction electrode substrate 3.

In addition, the planar electrode 7, the composite electrode 9, and the insulating resin 4 and the discharge electrode substrate 2 interposed between the planar electrode 7 and the composite electrode 9 form the capacitor 21. The planar electrode 8, the composite electrode 10, and the insulating resin 4 and the discharge electrode substrate 2 interposed between the planar electrode 8 and the composite electrode 10 form the capacitor 22.

As a result, a capacitance $C1$ of each of the capacitors 21, 22 is expressed by the following equation. In the following equation, S is an area of the overlapping region R, $d11$ is a distance between the discharge electrode substrate 2 and the composite electrodes 9, 10, $d1$ is a thickness of the discharge electrode substrate 2, $\varepsilon$ is a dielectric constant of the insulating resin 4, and $\varepsilon 1$ is a dielectric constant of the discharge electrode substrate 2.

$$1/C1 = 1/\varepsilon(S/d11) + 1/\varepsilon 1(S/d1)$$

The capacitance $C1$ of each of the capacitors 21, 22 can be adjusted by adjusting at least one of the area S, the dielectric constants $\varepsilon$, $\varepsilon 1$, the distance $d11$, and the thickness $d1$.

As illustrated in FIG. 6, the ion generation device 14 is configured in the same manner as the ion generation device 11, except that the composite electrode 9 (composite electrode 10) is formed on a surface of the induction electrode substrate 3 opposite to the surface of the induction electrode substrate 3 facing the discharge electrode substrate 2.

In addition, the planar electrode 7, the composite electrode 9, and the insulating resin 4 and the induction electrode substrate 3 interposed between the planar electrode 7 and the composite electrode 9 form the capacitor 21. The planar electrode 8, the composite electrode 10, and the insulating resin 4 and the induction electrode substrate 3 interposed between the planar electrode 8 and the composite electrode 10 form the capacitor 22.

As a result, a capacitance $C2$ of each of the capacitors 21, 22 is expressed by the following equation. In the following equation, S is an area of the overlapping region R, $d12$ is a distance between the induction electrode substrate 3 and the planar electrodes 7, 8, $d2$ is a thickness of the induction electrode substrate 3, $\varepsilon$ is a dielectric constant of the insulating resin 4, and $\varepsilon 2$ is a dielectric constant of the induction electrode substrate 3.

$$1/C2 = 1/\varepsilon(S/d12) + 1/\varepsilon 2(S/d2)$$

The capacitance $C2$ of each of the capacitors 21, 22 can be adjusted by adjusting at least one of the area S, the dielectric constants $\varepsilon$, $\varepsilon 2$, the distance $d12$, and the thickness $d2$.

As illustrated in FIG. 7, in the ion generation device 15, the planar electrode 7 (planar electrode 8) is formed on the surface of the discharge electrode substrate 2 opposite to the surface of the discharge electrode substrate 2 facing the induction electrode substrate 3. In addition, in the ion generation device 15, the composite electrode 9 (composite electrode 10) is formed on the surface of the induction electrode substrate 3 opposite to the surface of the induction electrode substrate 3 facing the discharge electrode substrate 2. Except this configuration, the ion generation device 15 is configured in the same manner as the ion generation device 11.

Furthermore, the planar electrode 7, the composite electrode 9, and the insulating resin 4, the discharge electrode substrate 2, and the induction electrode substrate 3 interposed between the planar electrode 7 and the composite electrode 9 form the capacitor 21. The planar electrode 8, the composite electrode 10, and the insulating resin 4, the discharge electrode substrate 2, and the induction electrode substrate 3 interposed between the planar electrode 8 and the composite electrode 10 form the capacitor 22.

As a result, a capacitance C3 of each of the capacitors 21, 22 is expressed by the following equation. In the following equation, S is an area of the overlapping region R, d13 is a distance between the discharge electrode substrate 2 and the induction electrode substrate 3, d1 is a thickness of the discharge electrode substrate 2, and d2 is a thickness of the induction electrode substrate 3. In addition, ε is a dielectric constant of the insulating resin 4, ε1 is a dielectric constant of the discharge electrode substrate 2, and ε2 is a dielectric constant of the induction electrode substrate 3.

$$1/C3=1/\varepsilon(S/d13)+1/\varepsilon1(S/d1)+1/\varepsilon2(S/d2)$$

The capacitance C3 of each of the capacitors 21, 22 can be adjusted by adjusting at least one of the area S, the dielectric constants ε, ε1, ε2, the distance d13, and the thicknesses d1, d2.

As described above, the ion generation devices 13 to 15 include at least one of the discharge electrode substrate 2 and the induction electrode substrate 3 as a dielectric of the capacitors 21, 22.

As a result, the capacitances C1 to C3 of the capacitors 21, 22 can be also adjusted by appropriately adjusting the thickness d1 and the dielectric constant ε1 of the discharge electrode substrate 2 and the thickness d2 and the dielectric constant ε2 of the induction electrode substrate 3.

Third Embodiment

Still another embodiment of the present invention will be described below with reference to FIG. 8. Note that, for the sake of description, components having functions the same as the functions of the components described in the first and second embodiments are denoted by the same reference signs, and description thereof will be omitted.

Figure 8:
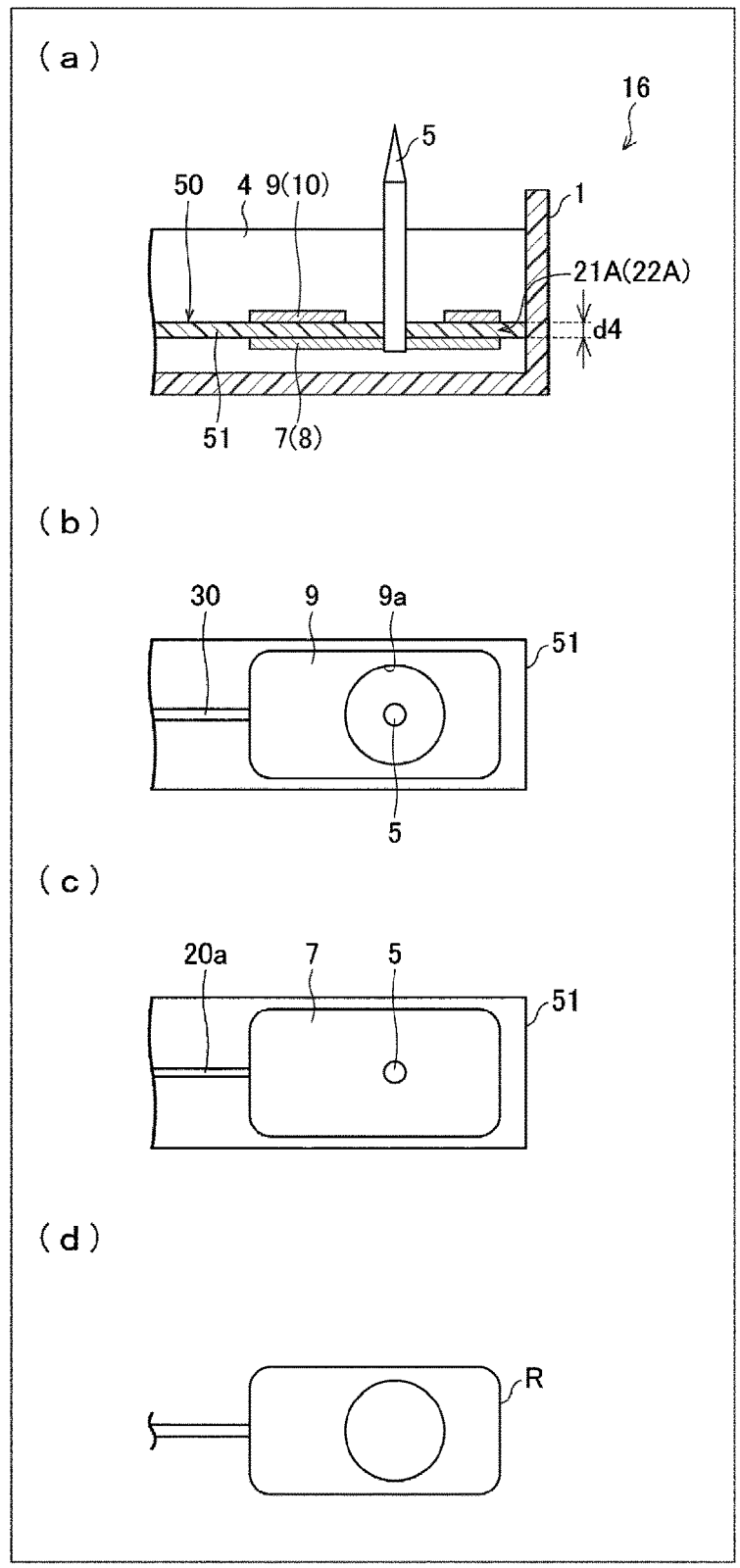
FIG. 8(a) is a vertical cross-sectional view illustrating a configuration of a part of an ion generation device according to a third embodiment of the present invention.
FIG. 8(b) is a top view illustrating a configuration of a double-sided substrate in the ion generation device of FIG. 8(a)
FIG. 8(c) is a bottom view illustrating the configuration of the double-sided substrate of FIG. 8(a)
FIG. 8(d) is a view illustrating an overlapping region in which a planar electrode formed on the double-sided substrate and a composite electrode overlap each other in a direction perpendicular to a surface of the double-sided substrate.

(a) of FIG. 8 is a vertical cross-sectional view illustrating a configuration of a part of an ion generation device 16 according to a third embodiment. (b) of FIG. 8 is a top view illustrating a configuration of a double-sided substrate 51 in the ion generation device 16 of (a) of FIG. 8. (c) of FIG. 8 is a bottom view illustrating a configuration of the double-sided substrate 51. (d) of FIG. 8 is a view illustrating an overlapping region in which the planar electrodes 7, 8 and the composite electrodes 9, 10 formed on the double-sided substrate 51 overlap with each other in a direction perpendicular to a surface of the double-sided substrate 51.

Note that in (a) to (d) of FIG. 8, illustration of a portion including the planar electrode 8 and the composite electrode 10 is omitted for convenience, but the portion is also configured in the same manner as the portion illustrated in (a) to (c) of FIG. 8. In particular, in (a) of FIG. 8, the reference signs of the planar electrode 8, the composite electrode 10, and a capacitor 22A are added.

As illustrated in (a) of FIG. 8, the ion generation device 16 includes a discharge substrate 50 in place of the discharge electrode substrate 2 and the induction electrode substrate 3 of the ion generation device 11. The discharge substrate 50 includes the double-sided substrate 51 (substrate).

A shape and a size of the double-sided substrate 51 are the same as the shape and the size of the discharge electrode substrate 2 and the induction electrode substrate 3, respectively. A material of the double-sided substrate 51 is also the same as the material of the discharge electrode substrate 2 and the induction electrode substrate 3.

In addition, the ion generation device 16 includes capacitors 21A, 22A instead of the capacitors 21, 22 of the ion generation device 11.

The ion generation device 16 is configured in the same manner as the ion generation device 11 except for the configuration described above.

The discharge electrodes 5, 6 are mounted on the double-sided substrate 51 at the same positions as the positions at which the discharge electrodes 5, 6 are mounted on the discharge electrode substrate 2.

As illustrated in (c) of FIG. 8, the planar electrode 7 is formed on one surface of the double-sided substrate 51, and as illustrated in (b) of FIG. 8, the composite electrode 9 is formed on the other surface of the double-sided substrate 51. The planar electrode 8 is also formed on the one surface of the double-sided substrate 51, and the composite electrode 10 is also formed on the other surface of the double-sided substrate 51.

In addition, as illustrated in (d) of FIG. 8, the planar electrode 7 and the composite electrode 9 are opposed to each other in an overlapping region R in which the planar electrode 7 and the composite electrode 9 overlap with each other in a direction perpendicular to both surfaces of the double-sided substrate 51. The planar electrode 8 and the composite electrode 10 are opposed to each other in an overlapping region in which the planar electrode 8 and the composite electrode 10 overlap with each other in a direction perpendicular to both surfaces of the double-sided substrate 51, like the overlapping region R.

The planar electrode 7, the composite electrode 9, and the double-sided substrate 51 interposed between the planar electrode 7 and the composite electrode 9 form the capacitor 21A. The planar electrode 8, the composite electrode 10, and the double-sided substrate 51 interposed between the planar electrode 8 and the composite electrode 10 form the capacitor 22A. In the capacitors 21A, 22A, the double-sided substrate 51 functions as a dielectric.

A capacitance C4 of each of the capacitors 21A, 22A is represented by the following equation. In the following equation, S is an area of the overlapping region R, d4 is a thickness of the double-sided substrate 51, that is, a distance between the planar electrodes 7, 8 and the composite electrodes 9, 10, and ε4 is a dielectric constant of the double-sided substrate 51.

$$C4=\varepsilon4(S/d4)$$

The capacitance C4 of each of the capacitors 21A, 22A can be adjusted by adjusting at least one of the area S, the dielectric constant 4, and the thickness d4.

In the ion generation device 16 configured as described above, the planar electrode 7, the composite electrode 9, and the double-sided substrate 51 interposed between the planar electrode 7 and the composite electrode 9 form the capacitor 21A. In addition, in the ion generation device 16, the planar electrode 8, the composite electrode 10, and the double-sided substrate 51 interposed between the planar electrode 8 and the composite electrode 10 form the capacitor 22A.

This eliminates the need for a capacitor serving as a high-voltage component, which can reduce the area for mounting the capacitor on the double-sided substrate 51. As a result, the discharge substrate 50 can be minimized, so that the ion generation device 16 can be minimized.

Furthermore, the capacitors 21A, 22A are formed by using existing components such as the double-sided substrate 51 and an electrode pattern formed on the double-sided substrate 51. Thus, the ion generation device 16 can be made inexpensively. In addition, the capacitances of the capacitors 21A, 22A can be easily adjusted by adjusting at least one of the overlapping region of the patterns of the planar electrodes 7, 8 and the composite electrodes 9, 10, the thickness of the double-sided substrate 51, and the dielectric constant of the double-sided substrate 51.

Furthermore, in the ion generation device 16, like the ion generation device 11, the capacitors 21A, 22A are formed by using existing components as described above, rather than a floating capacitance. As a result, a stable capacitance can be obtained, and an induction electrode can be set as the reference of potential. In addition, because the ion generation device 16 is provided with the high-voltage capacitors 21A, 22A, the ion generation device 16 can smooth the waveform of the pulse voltage to achieve both an improvement in ion generation efficiency and a reduction in discharge noise, as with the ion generation device 11.

Fourth Embodiment

Still another embodiment of the present invention will be described with reference to FIG. 9. Note that, for the sake of description, components having functions the same as the functions of the components described in the first to third embodiments are denoted by the same reference signs, and description thereof will be omitted.

Figure 9:
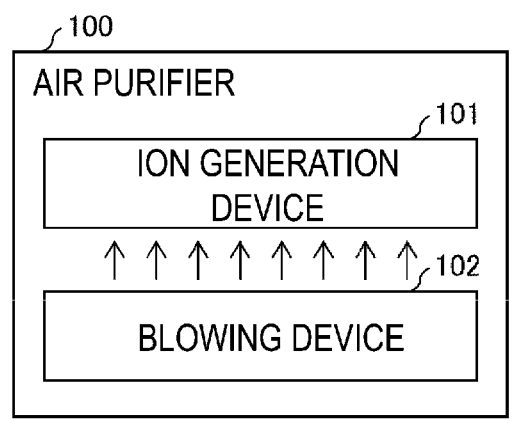
FIG. 9 is a plan view illustrating a schematic configuration of an air purifier according to a fourth embodiment of the present invention.

FIG. 9 is a plan view illustrating a schematic configuration of an air purifier 100 according to a fourth embodiment.

As illustrated in FIG. 9, the air purifier 100 (electronic device) includes an ion generation device 101 and a blowing device 102. The ion generation device 101 is any one of the ion generation devices 11 to 16 in the first to third embodiments.

In order to deliver ions generated by the ion generation device 101, the blowing device 102 generates a flow of air in a direction indicated by an arrow in FIG. 9.

Note that in the present embodiment, an example in which the ion generation device 101 is mounted in the air purifier 100 is described. In addition to the air purifier 100, the ion generation device 101 may be mounted in other electronic devices such as an air conditioner, a blower, a cleaner, a refrigerator, a deodorizer, a mattress dryer, a humidifier, a dehumidifier, cookware, or a dryer.

Supplement

An ion generation device according to a first aspect of the present invention includes: a discharge electrode substrate 2 on which a discharge electrode 5, 6 is mounted and a first electrode (planar electrode 7, 8) connected to the discharge electrode 5, 6 are formed; an induction electrode substrate 3 on which an induction electrode (composite electrode 9, 10) configured to generate a discharge between the induction electrode (composite electrode 9, 10) and the discharge electrode 5, 6 and a second electrode (composite electrode 9, 10) connected to the induction electrode are formed; and an insulating resin 4 filled at least between the discharge electrode 5, 6 and the induction electrode and providing insulation between the discharge electrode 5, 6 and the induction electrode, in which the first electrode and the second electrode are disposed so as to face each other at least partially, and the first electrode, the second electrode, and the insulating resin 4 interposed between the first electrode and the second electrode form a capacitor 21, 22.

According to the above configuration, the insulating resin is used as a dielectric, the first electrode is provided on the discharge electrode substrate, and the second electrode is provided on the induction electrode substrate to form the capacitor. Thus, a capacitor as a component may be eliminated. In addition, unlike a capacitor component, the first electrode and the second electrode have less constraints on mounting positions on the discharge electrode substrate and on the induction electrode substrate. Thus, the first electrode and the second electrode can be provided in regions not used in the discharge electrode substrate and the induction electrode substrate, respectively. This makes it unnecessary to secure a region for mounting the capacitor component on the discharge electrode substrate and the induction electrode substrate, and areas of the discharge electrode substrate and the induction electrode substrate can be reduced.

An ion generation device according to a second aspect of the present invention is the ion generation device according to the first aspect in which the discharge electrode substrate 2 may be formed of a resin, the first electrode may be formed on a surface of the discharge electrode substrate 2 opposite to a surface of the discharge electrode substrate 2 facing the induction electrode substrate 3, the second electrode may be formed on a surface of the induction electrode substrate 3 facing the discharge electrode substrate 2, and the first electrode, the second electrode, and the insulating resin 4 and the discharge electrode substrate 2 interposed between the first electrode and the second electrode may form the capacitor 21, 22.

According to the above configuration, the discharge electrode substrate is added as a dielectric. Thus, it is possible to adjust the capacitance of the capacitor by appropriately changing the thickness and the dielectric constant of the discharge electrode substrate.

An ion generation device according to a third aspect of the present invention is the ion generation device according to the first aspect in which the induction electrode substrate 3 may be formed of a resin, the first electrode may be formed on a surface of the discharge electrode substrate 2 facing the induction electrode substrate 3, the second electrode may be formed on a surface of the induction electrode substrate 3 opposite to a surface of the induction electrode substrate 3 facing the discharge electrode substrate 2, and the first electrode, the second electrode, and the insulating resin 4 and the induction electrode substrate 3 interposed between the first electrode and the second electrode may form the capacitor 21, 22.

According to the above configuration, the induction electrode substrate is added as a dielectric. Thus, it is possible to adjust the capacitance of the capacitor by appropriately changing the thickness and the dielectric constant of the induction electrode substrate.

An ion generation device according to a fourth aspect of the present invention is the ion generation device according to the first aspect in which the discharge electrode substrate 2 and the induction electrode substrate 3 may be formed of a resin, the first electrode may be formed on a surface of the discharge electrode substrate 2 opposite to a surface of the discharge electrode substrate 2 facing the induction electrode substrate 3, the second electrode may be formed on a surface of the induction electrode substrate 3 opposite to a surface of the induction electrode substrate 3 facing the discharge electrode substrate 2, and the first electrode, the second electrode, and the insulating resin 4, the discharge electrode substrate 2, and the induction electrode substrate 3 interposed between the first electrode and the second electrode may form the capacitor 21, 22.

According to the above configuration, the discharge electrode substrate and the induction electrode substrate are added as a dielectric. Thus, it is possible to adjust the capacitance of the capacitor by appropriately changing the thickness and the dielectric constant of at least one of the discharge electrode substrate and the induction electrode substrate.

An ion generation device according to a fifth aspect of the present invention is the ion generation device according to any one of the first to third aspects further including a housing 1 that incorporates the discharge electrode substrate 2 and the induction electrode substrate 3, in which the insulating resin 4 may be filled in the housing 1 and include: a first resin layer 41 filled between the discharge electrode substrate 2 and the induction electrode substrate 3; and a second resin layer 42 in contact with either one of the discharge electrode substrate and the induction electrode substrate, and a resin material forming the first resin layer 41 and a resin material forming the second resin layer 42 may be different.

According to the above configuration, an expensive resin material having a high dielectric constant can be used for forming the first resin layer, while an inexpensive resin material having a low dielectric constant can be used for forming the second resin layer. Thus, it is not necessary to use an expensive resin material for all the insulating resins in order to ensure the required performance of the capacitor, which can make it possible to suppress the price increase of the ion generation device.

A discharge substrate according to a sixth aspect of the present invention includes: a substrate (double-sided substrate 51) formed of a resin; a discharge electrode 5, 6 mounted on the substrate; an induction electrode (composite electrode 9, 10) that generates a discharge between the induction electrode and the discharge electrode 5, 6; a first electrode (planar electrode 7, 8) formed on one surface of the substrate and connected to the discharge electrode 5, 6; and a second electrode (composite electrode 9, 10) formed on the other surface of the substrate along with the induction electrode and connected to the induction electrode, in which the first electrode and the second electrode are disposed so as to face each other at least partially and the first electrode, the second electrode, and the substrate interposed between the first electrode and the second electrode form a capacitor.

According to the above configuration, the substrate is used as a dielectric and the first electrode and the second electrode are formed on the substrate to form the capacitor. Thus, a capacitor as a component may be eliminated. In addition, unlike a capacitor component, the first electrode and the second electrode have less constraints on the mounting positions on the substrate. Thus, the first electrode and the second electrode can be provided in a region not used in the substrate. This makes it unnecessary to secure a region for mounting the capacitor component on the substrate, and it is possible to reduce the area of the substrate.

An ion generation device according to a seventh aspect of the present invention includes the discharge substrate of the sixth aspect.

An electronic devices according to an eighth aspect of the present invention includes the ion generation device of the first, second, third, fourth, fifth, or seventh aspect.

Supplementary Information

The present invention is not limited to each of the above-described embodiments. It is possible to make various modifications within the scope of the claims. An embodiment obtained by appropriately combining technical elements each disclosed in different embodiments falls also within the technical scope of the present invention. Furthermore, technical elements disclosed in the respective embodiments may be combined to provide a new technical feature.

The invention claimed is:

1. An ion generation device comprising:
a discharge electrode substrate on which a discharge electrode is mounted and a first electrode connected to the discharge electrode is formed;
an induction electrode substrate on which an induction electrode configured to generate a discharge between the induction electrode and the discharge electrode and a second electrode connected to the induction electrode are formed; and
an insulating resin filled at least between the discharge electrode and the induction electrode and providing insulation between the discharge electrode and the induction electrode,
wherein the first electrode and the second electrode are disposed and face each other at least partially, and
the first electrode, the second electrode, and the insulating resin interposed between the first electrode and the second electrode form a capacitor.

2. The ion generation device according to claim 1,
wherein the discharge electrode substrate is formed of a resin,
the first electrode is formed on a surface of the discharge electrode substrate opposite to a surface of the discharge electrode substrate facing the induction electrode substrate,
the second electrode is formed on a surface of the induction electrode substrate facing the discharge electrode substrate, and
the first electrode, the second electrode, and the insulating resin and the discharge electrode substrate interposed between the first electrode and the second electrode form the capacitor.

3. The ion generation device according to claim 1,
wherein the induction electrode substrate is formed of a resin,
the first electrode is formed on a surface of the discharge electrode substrate facing the induction electrode substrate,
the second electrode is formed on a surface of the induction electrode substrate opposite to a surface of the induction electrode substrate facing the discharge electrode substrate, and
the first electrode, the second electrode, and the insulating resin and the induction electrode substrate interposed between the first electrode and the second electrode form the capacitor.

4. The ion generation device according to claim 1,
wherein the discharge electrode substrate and the induction electrode substrate are formed of a resin,
the first electrode is formed on a surface of the discharge electrode substrate opposite to a surface of the discharge electrode substrate facing the induction electrode substrate,
the second electrode is formed on a surface of the induction electrode substrate opposite to a surface of the induction electrode substrate facing the discharge electrode substrate, and
the first electrode, the second electrode, and the insulating resin, the discharge electrode substrate, and the induction electrode substrate interposed between the first electrode and the second electrode form the capacitor.

5. The ion generation device according to claim 1, further comprising
a housing incorporating the discharge electrode substrate and the induction electrode substrate,
wherein the insulating resin is filled in the housing and includes: a first resin layer filled between the discharge electrode substrate and the induction electrode substrate and a second resin layer in contact with either one of the discharge electrode substrate and the induction electrode substrate, and a resin material forming the first resin layer and a resin material forming the second resin layer are different.

6. A discharge substrate comprising:
a substrate formed of a resin;
a discharge electrode mounted on the substrate;
an induction electrode configured to generate a discharge between the induction electrode and the discharge electrode;
a first electrode formed on one surface of the substrate and connected to the discharge electrode; and
a second electrode formed on another surface of the substrate along with the induction electrode and connected to the induction electrode,
wherein the first electrode and the second electrode are disposed and face each other at least partially, and
the first electrode, the second electrode, and the substrate interposed between the first electrode and the second electrode form a capacitor.

7. An ion generation device comprising:
the discharge substrate described in claim 6.

* * * * *